United States Patent
Chiola et al.

(10) Patent No.: US 7,196,397 B2
(45) Date of Patent: Mar. 27, 2007

(54) TERMINATION DESIGN WITH MULTIPLE SPIRAL TRENCH RINGS

(75) Inventors: Davide Chiola, Marina Del Rey, CA (US); He Zhi, El Segundo, CA (US); Kohji Andoh, El Segundo, CA (US); Daniel M. Kinzer, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/073,123

(22) Filed: Mar. 4, 2005

(65) Prior Publication Data

US 2005/0230777 A1 Oct. 20, 2005

Related U.S. Application Data

(60) Provisional application No. 60/550,096, filed on Mar. 4, 2004.

(51) Int. Cl.
  *H01L 27/02* (2006.01)
  *H01L 27/04* (2006.01)
  *H01L 21/02* (2006.01)

(52) U.S. Cl. .............. 257/531; 257/528; 257/E27.009; 257/E27.01; 257/E21.022; 438/379; 438/570

(58) Field of Classification Search ............. 257/484, 257/483, 480, 531, 528, E27.009, E27.01, 257/E21.022; 438/379, 570
See application file for complete search history.

(56) References Cited

U.S. PATENT DOCUMENTS

| | | | |
|---|---|---|---|
| 5,382,825 A | | 1/1995 | Neilson |
| 5,492,856 A | * | 2/1996 | Ikeda et al. ................. 438/381 |
| 6,469,609 B2 | * | 10/2002 | Lee et al. .................... 336/200 |
| 6,707,128 B2 | * | 3/2004 | Moriguchi et al. ......... 257/484 |
| 6,794,727 B2 | * | 9/2004 | Leduc et al. ................ 257/531 |
| 6,830,970 B2 | * | 12/2004 | Gardes ....................... 438/238 |
| 6,855,593 B2 | | 2/2005 | Andoh et al. |
| 6,939,788 B2 | * | 9/2005 | Davies ....................... 438/599 |
| 7,030,031 B2 | * | 4/2006 | Wille et al. ................. 438/725 |
| 2003/0231093 A1 | * | 12/2003 | Hsu et al. .................... 336/200 |

OTHER PUBLICATIONS

Diffused Spiral Junction Termination Structure: Modeling and Realization—Dejan Krizaj, Slavko Amon, Georges Charitat—pp. 247-250—1996 IEEE.
V. Macary et al., "Comparison Between Biased and Floating Guard Rings Used As Junction Termination technique," Proceedings of 1992 International Symposium on Power Semiconductor Devices & ICs, Tokyo, Japan, pp. 230-233.
K. Endo et al., "A 500V 1A 1-Chip Inverter IC With a New Electric Field Reduction Structure," Proc. Of the 6th Internat. Symposium on Power Semiconductor Devices & ICs, Davos, Switzerland, (May 31-Jun. 2, 1994), pp. 379-383.

* cited by examiner

*Primary Examiner*—Leonardo Andujar
*Assistant Examiner*—Victor A. Mandala, Jr.
(74) *Attorney, Agent, or Firm*—Ostrolenk, Faber, Gerb & Soffen, LLP

(57) ABSTRACT

A semiconductor device having a termination structure, which includes at least one spiral resistor disposed within a spiral trench and connected between two power poles of the device.

16 Claims, 6 Drawing Sheets

TERMINATION DESIGN WITH MULTIPLE SPIRAL TRENCH RINGS

RELATED APPLICATION

This application is based on and claims benefit of U.S. Provisional Application No. 60/550,096, filed on Mar. 4, 2004, entitled Termination Design with Equidistant Spiral Trench Rings, to which a claim of priority is hereby made and the disclosure of which is incorporated by reference.

FIELD OF THE INVENTION

The present invention relates to semiconductor devices and more particularly to a termination structure for a power semiconductor device.

BACKGROUND OF THE INVENTION

A typical semiconductor device usually includes an active region which includes a rectifying junction such as a PN junction or a schottky junction.

The breakdown down voltage of a rectifying junction is usually less than its theoretical limit because certain locations on the rectifying junction have a tendency to develop higher electric fields under reverse bias conditions. The rectifying junction at the terminal edge of the active region of a device, for example, experiences higher electric fields.

To reduce the intensity of the electric fields near the edge of a rectifying junction (e.g. PN junction), high voltage semiconductor devices may include an edge termination structure. An edge termination structure provides a transition region in which the high electric fields around the active area change gradually to the lower potential at the edge of the device. A termination structure lowers the field intensity around the termination region of a rectifying junction by spreading the electric field lines across the termination region.

Field plates with single or multiple guard ring structures are common termination techniques for low to mid voltage (15–200V) semiconductor devices such as trench Schottky diodes and MOSgated devices. In the trench Schottky diode such as the one disclosed in copending application Ser. No. 10/193,783, filed Jul. 11, 2002 (IR-1663), a recessed termination structure using a field plate is formed, as schematically shown in FIG. 1. In FIG. 1, a termination recess 10 is formed in epitaxially deposited substrate 11 by a trench etch. Field oxide 12 can be grown during the gate oxidation process, or deposited by a TEOS or LTO layer in a separate process step. After termination oxide 12 is grown, polysilicon is deposited to fill all trenches. The polysilicon is then doped and etched back so that spacer 13 is left on the sidewalls of termination region. Schottky layers 20 and contact metal layers 21 are next deposited and patterned to form a field plate overlapping termination oxide 12. The trench depth scales with the breakdown voltage: mid voltage (100V) trench devices usually require a deep trench (3~5 μm), hence termination recess 10 which was produced at the same step as the trench etch for active area trenches 22 becomes very deep (~6 μm for a 5 μm trench, due to the loading effect of the dry etch process). When photo resist (PR) 30 is coated in the metal mask process, it tends to get thinner at the poly shoulder (above the left hand spacer), and, in the metal etch process, photoresist 30 at the shoulder will eventually break. The etching solution will then penetrate the opening and undercut aluminum 21 and schottky barrier 20 metals in the active mesa region. This will introduce high yield loss during the manufacturing process.

U.S. Pat. No. 5,382,825 discusses a variety of termination structures and their respective drawbacks. To improve on the prior art termination structures discussed therein, U.S. Pat. No. 5,382,825 discloses a termination structure which includes a single spiral ribbon of resistive material disposed around the active region of a semiconductor device to gradually relieve the electric fields near the edge of the rectifying junction of the active region of a semiconductor device. FIG. 2 illustrates an example of a spiral termination structure. Endo in K. Endo et al., "A 500V 1A 1-Chip Inverter with a new electric field reduction structure". Proc. ISPSD-94, pp. 379–383 also demonstrates the use of polysilicon as a two dimensional resistive layer on the top of an oxide layer.

The spiral ribbon disclosed by U.S. Pat. No. 5,382,825 is formed on a surface of the semiconductor device. As a result, if the spiral ribbon is widened to vary the resistance thereof the lateral expanse of the spiral is increased, and thus more die area is required resulting in a larger and more expensive die.

The concept of a spiral termination is described by Macary et al. and Krizaj et al. in V. Macary et al., "Comparison between biased and floating guard rings as the junction termination technique", Proc. ISPSD-92, Tokyo, Japan, pp. 230–233 and D. Krizaj et al., "Diffused Spiral Junction termination structure: Modeling and Realization", Proc. ISPSD-96, pp. 247–250. The leakage in the junction termination ring "partitions" the potential along the spiral ring and decreases the high electric field. However, an increase of the leakage current due to the hole injection appears before breakdown.

BRIEF DESCRIPTION OF THE INVENTION

In order to overcome the above limitations a new termination design is provided, in which doped polycrystalline silicon is confined in a plurality of spaced interleaved spiral trenches isolated by an oxide side-wall and is used as a resistor to drop the potential evenly between the power nodes of the semiconductor device. The trenches surround the active area in a "spiral" mode, and each is preferably equidistant from its adjacent trenches.

According to an aspect of invention, the doped polysilicon is trapped in the trenches having a layer of oxide to isolate the rings from each other. Thus hole injection can be avoided.

According to another aspect of the present invention the resistivity of the polysilicon resistors can be configured by varying the depth of the trenches, thereby reducing the need for lateral consumption of the semiconductor die.

Another unique property distinguishing a termination structure according to the present invention from known spiral terminations is its layout. In the previous concepts, there is only one spiral connecting anode and cathode, as illustrated in FIG. 2. Thus, it could not be a centric structure. Usually the die itself is centric, for example, in the shape of a square. Therefore, the spiral termination normally introduces a non-uniform electric field, as shown in FIG. 2. The proposed new spiral termination design enables the field to have a 90° rotational symmetry around the center of the die.

DETAILED DESCRIPTION OF THE DRAWINGS

Figure 3:
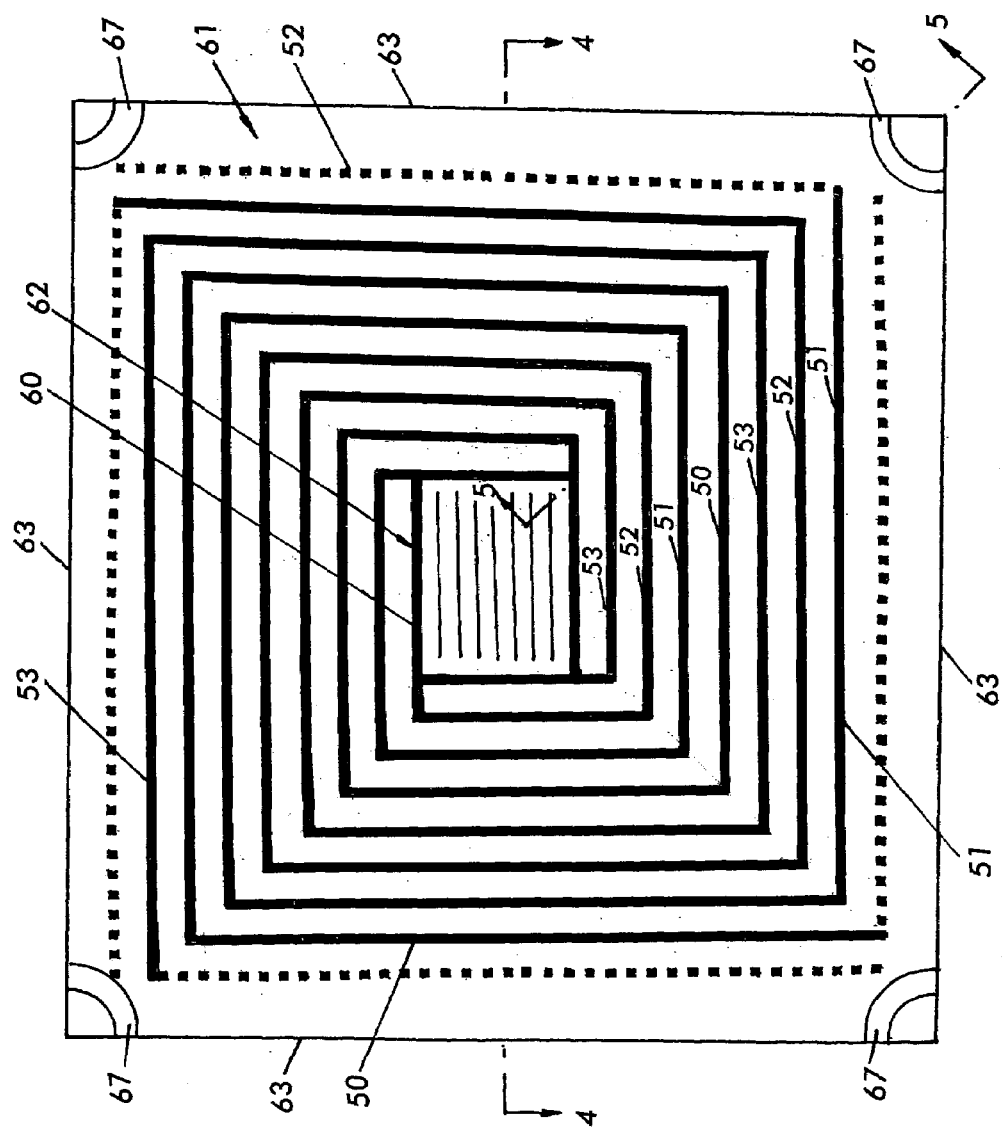
FIG. 3 shows schematically the top of a trench Schottky diode with a pattern of four interleaved spiral termination segments in accordance with the invention.
Figure 4:
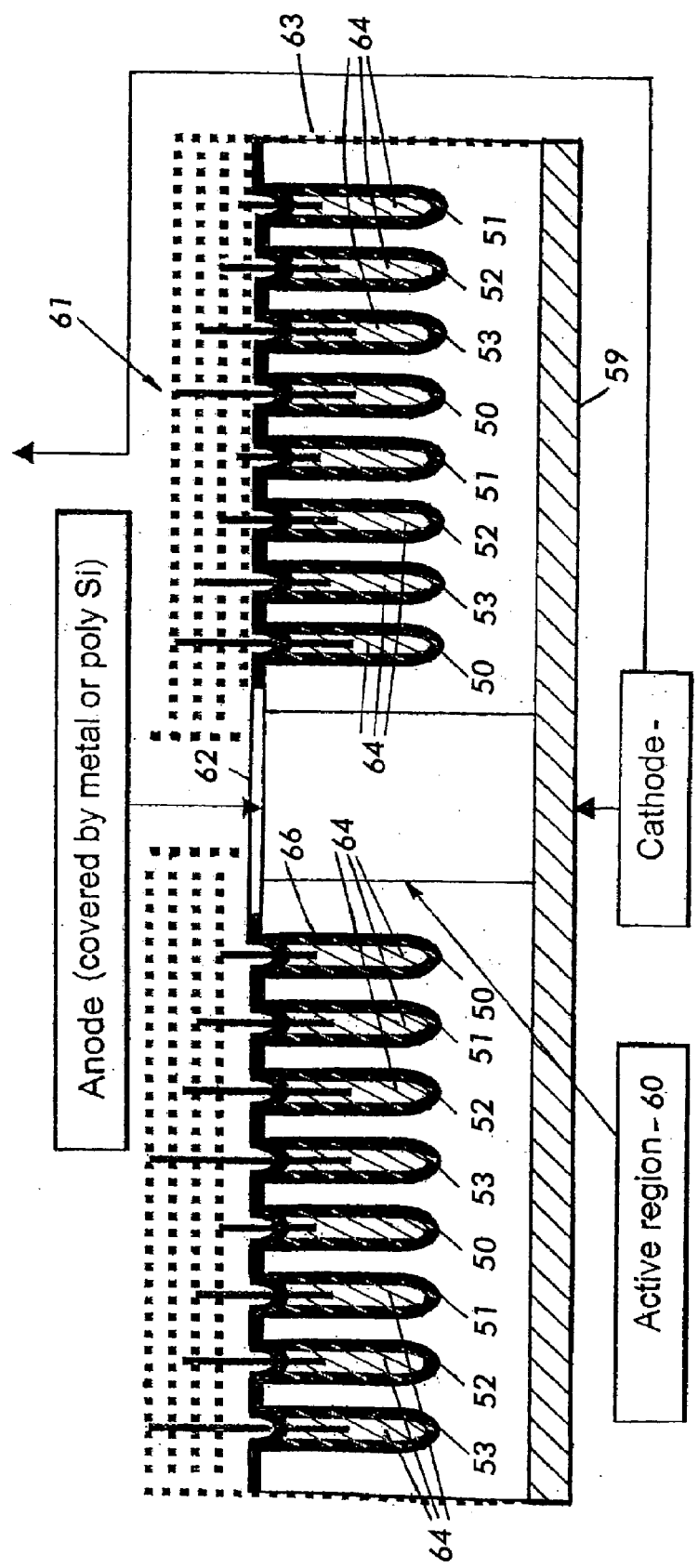
FIG. 4 is a schematic cross-sectional view taken across section line 4—4 in FIG. 3 viewed in the direction of the arrows.

Referring to FIGS. 3 and 4, a semiconductor device according to the present invention includes active region 60 and termination region 61 adjacent active region 60. Active region 60 and termination region 61 are formed in a single semiconductor die. Termination region 61 is disposed around active region 60 and extends from preferably the outer periphery of active region 60 to preferably edge 63 of the die.

In the Embodiment shown by FIGS. 3 and 4, active region 60 constitutes a schottky diode including anode contact 62 serving as the external connection to the anode pole thereof, and cathode contact 59 serving as the external connection to the cathode pole thereof. Thus, in the example illustrated by FIGS. 3 and 4 the rectifying junction of the active region is a schottky junction, which as is known in the prior art is formed by the schottky contact of a metal with a semiconductor body. As is well known a schottky rectifying junction may experience high electric fields at the edge thereof. A termination structure according to the present invention gradually drops the voltage between the power nodes (e.g. anode node and cathode node) of the device to relieve the edges of the rectifying junction from high voltage build-up, whereby the breakdown voltage of the device is improved. It should be noted that the present invention is not limited to schottky diodes, but may include power MOSFETs, IGBTs, PN diodes or the like.

Figure 1:
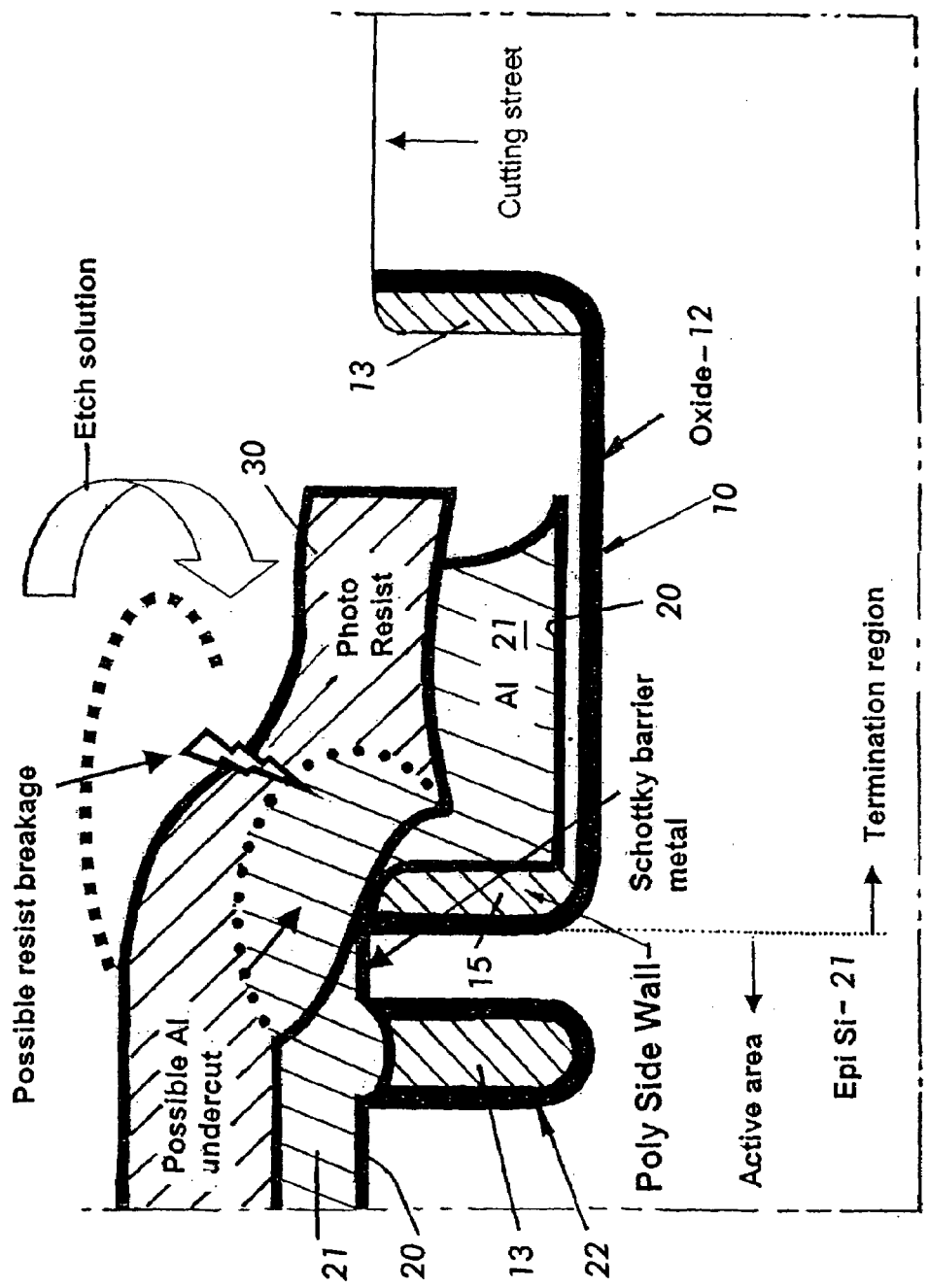
FIG. 1 is a cross-section of the termination trench of a prior art trench Schottky diode.
Figure 2:
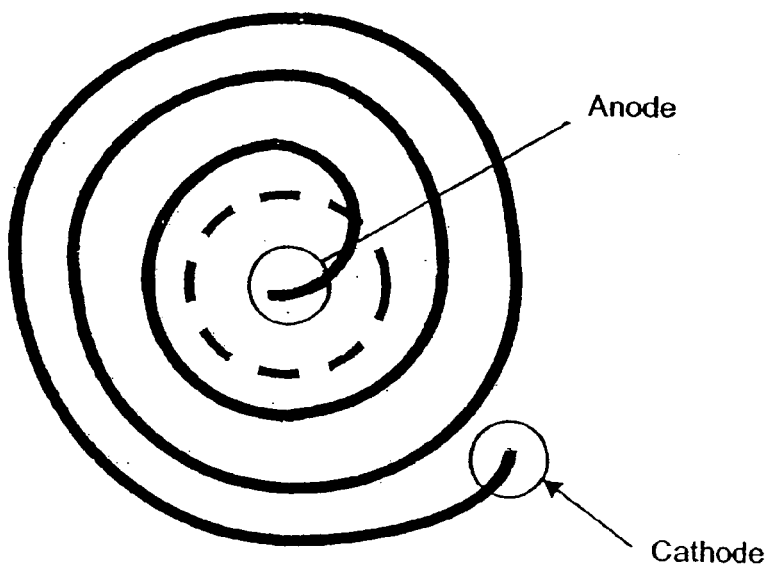
FIG. 2 is a schematic diagram of the field (in dotted lines) of a prior art spiral termination structure.
Figure 5:
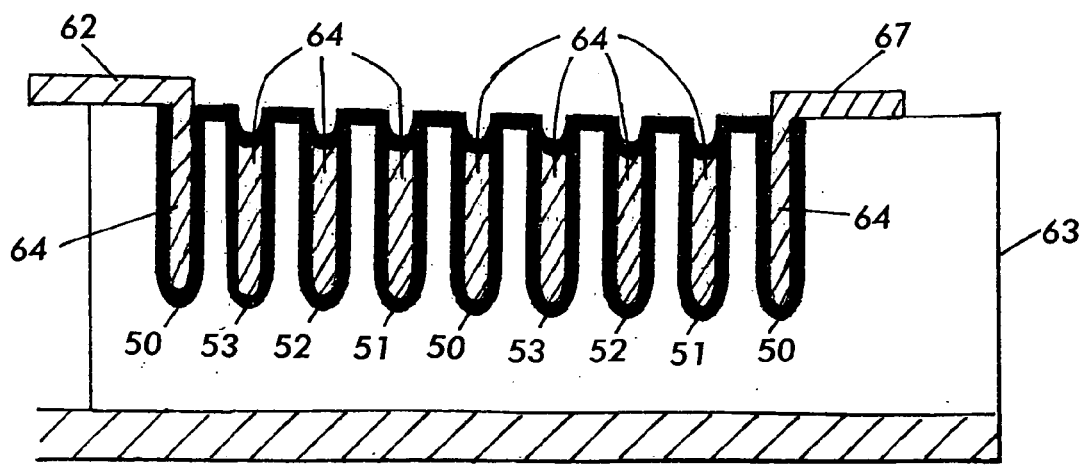
FIG. 5 is a cross-sectional view taken across line 5—5 in FIG. 3 viewed in the direction of the arrows.
Figure 7:
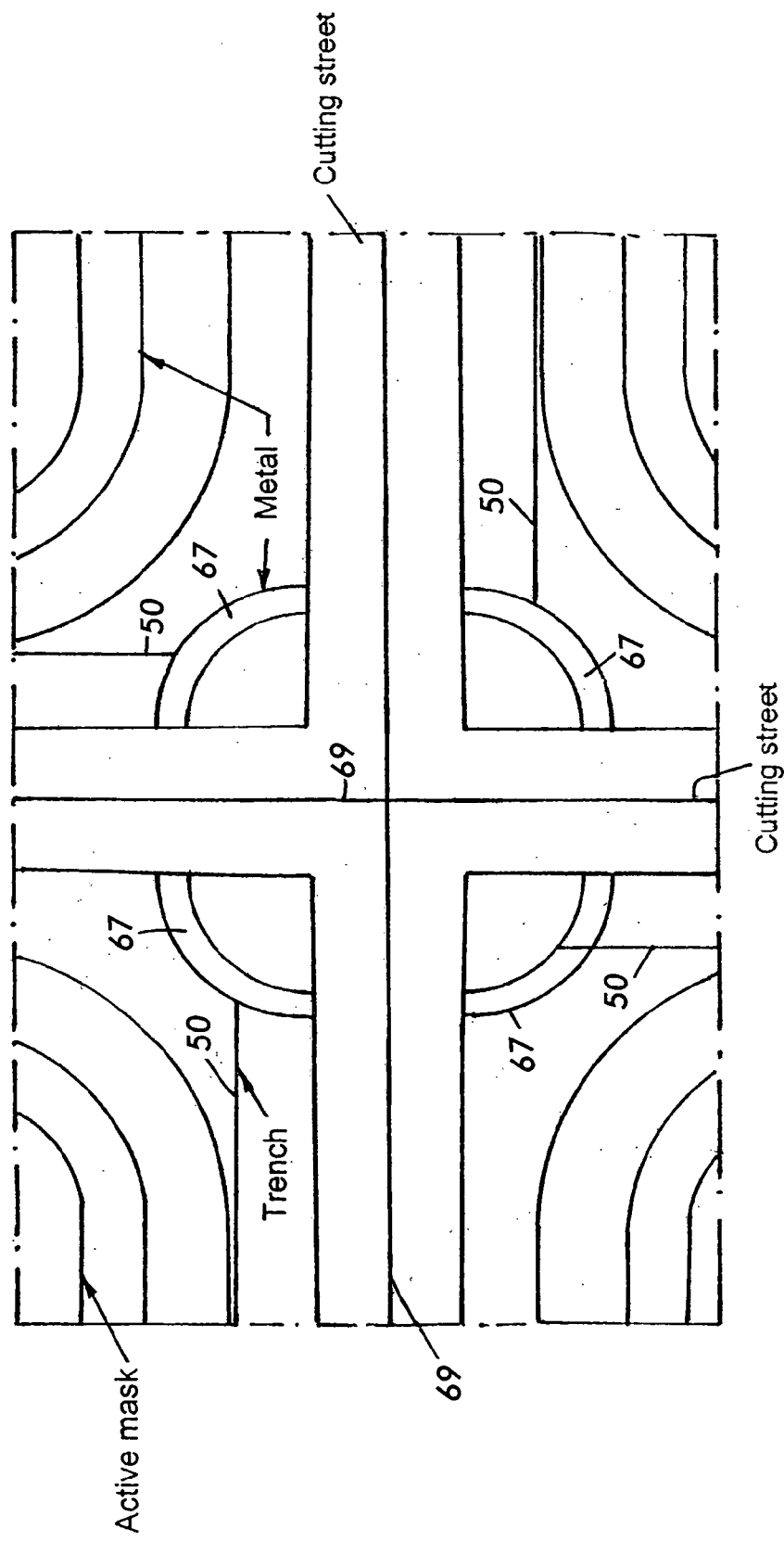
FIG. 7 shows a typical mask layout at the intersection of four different die within a wafer.

According to one aspect of the present invention termination region 64 includes at least one spiral trench 50 disposed around active region 60. Spiral trench 50 includes an electrically conductive but resistive body residing therein forming resistor 64. Resistor 64 follows the contour of trench 50 and, therefore, is spiral as well. Resistor 64 is electrically connected at one end thereof to one power pole of the device, for example, anode 62, and at the other end thereof to the other power pole thereof, for example, cathode 59. For example, spiral resistor 50 is electrically connected to anode contact 62 at one end thereof, and electrically connected to metal coupler 67 (FIG. 5) at a corner of the semiconductor die. Coupler 67 is electrically connected to the cathode pole through the body of the semiconductor die and is formed during the singulation; i.e. when a die is cut out of a wafer along streets 69, as illustrated, for example, in FIG. 7. Spiral resistor 64 serves to gradually drop the voltage between the two power poles and thus relaxes the high electric fields that appear at the edge of the rectifying junction in active region 60, under for example reverse bias conditions.

It should be noted that the resistivity of the spiral resistor 64 depends on the bulk resistivity of the electrically conductive but resistive material which is used to form the same, (i.e. concentration of dopants in the bulk material) as well as the cross-section and the length thereof. The length of spiral resistor 64 can be increased by adding additional loops whereby spiral resistor 64 will be capable of dropping a higher voltage. The cross-section of spiral resistor 64 can be varied by varying the width as well as the depth thereof. Thus, the resistivity of spiral resistor 64 can be varied without requiring lateral area, for example, by extending the depth of trench 50, without increasing the lateral length thereof. As a result, compared to prior art, less die area is consumed if resistance of spiral resistor 64 is increased.

According to one aspect of the present invention, an insulation body 66 is formed on the sidewalls and the bottom of trench 50. Insulation body 66 is interposed between spiral resistor 64 and the sidewalls and the bottom of trench 50, whereby leakage current can be eliminated.

According to another aspect of the present invention, termination region 61 includes, not one, but a plurality of trenches 50, 51, 52, 53. Each trench has disposed therein a respective spiral resistor 64, and a respective insulation body 66. Each spiral resistor is connected at one end thereof to a power pole of the device, and at the other end thereof to the other power pole of the device. Thus, in the embodiment shown by FIGS. 3 and 4, each spiral resistor 64 is connected to the anode pole at one end thereof and to the cathode pole at the other end thereof in the same manner as spiral resistor 64 in trench 50 as described above.

According to an aspect of the present invention each end of each spiral resistor 64 is connected to a location different from the other ends preferably to eliminate non-uniformity in the electric field around active region 60 due to the location of the connection of spiral resistor 64 to the power poles of the device. Thus, for example, in the preferred embodiment, in which power pole 62 (e.g. anode pole) is square-shaped (as seen in FIG. 3) one end of each spiral resistor 64 is connected to a respective corner of power pole 62, and the other end of each spiral resistor 64 terminates at, or near a respective corner of the die the location of each end being chosen to ensure uniform voltage drop to reduce electric field non-uniformity around active region 60. Furthermore, each spiral resistor 64 has the same resistance as the others. This can be accomplished by ensuring that each spiral resistor 64 has the same length and cross-section as the others. To do so, for example, trenches 50, 51, 52, 53 are spaced equidistantly, have the same width and depth, and begin at a respective corner of power pole 62 and terminate at a respective corner of the die having looped the same number of turns around active region 60, whereby the length of a spiral resistor 64 in each trench 50, 51, 52, 53 is the same as the other spiral resistors 64.

Therefore, once the specific resistance (resistance/length) of the poly resistor is defined by the trench dimensions, the voltage will gradually decrease along the length of spiral resistors 64 from the anode voltage to the cathode voltage following Ohm's law. Due to the layout of the four trenches, the structure has a 90° rotational symmetry around the center of the die, i.e. the same field distribution is created on the four quadrants having the origin in the center of a rectangular die. It should be appreciated that any desired number of trench segments can be used without deviating from the scope and spirit of the present invention, and four trenches are shown only as an example.

Trenches 50 to 53 are preferably produced by a dry etch process. The trench depths can be from 0.5 to 10 μm and the trench widths can be from 0.5 to 5 μm. The trench side-walls are covered by silicon dioxide, which can be grown by thermal oxidation or which can be a deposited oxide film.

The preferred oxide thickness at the trench sidewall can be from 100 Å to 6000 Å, which will be determined by the breakdown voltage of trench cell. Polysilicon filler is deposited to fill each of the trenches and acts as the resistor. The resistance of the polysilicon can be adjusted by doping. The doping profile in a vertical direction can be either uniform, as provided by deposition of in-situ doped poly, or non-uniform, as provided by implant-and-drive doping techniques.

The design rules for a preferred embodiment are as follows:

1. The anode contact 62 should contact spiral resistors 64 in the trench at least at the beginning of each of trenches 50–53.

2. Once the resistivity of each spiral trench 50–53 is defined (width, depth, poly doping), enough length of each spiral resistor 64 should be left non-contacted by anode metal 62 in order to ensure that the entire breakdown voltage is dropped within the termination area.

3. The end of each trench 50–53 should be shorted to the cathode 59 (for example in the cutting street at which die are prepared from a parent wafer).

4. The length of each spiral resistor 64 contacted directly by anode contact 62 should be the same for each of the spiral resistors 64 in order for each resistor to drop the same amount of voltage in a unit length.

FIGS. 3 and 4 show only two turns for each spiral trench 50–53. In an actual implementation, the number of the turns is determined by the required resistance of each spiral resistor 64 (width and depth), the voltage needed to be dropped, and the die size as will be understood by those skilled in the art. It should be noted that at least one turn is required for each trench 50–53. Therefore, the last segment of each trench 50–53 is indicated by a dotted line suggesting that it could need more turns. Finally, each spiral resistor 64 in each trench 50–53 is connected to cathode 59 by a metal pad in the cutting street of the device.

In FIGS. 3 and 4, the trenches 50–53 turn counter-clockwise, but they can also turn clockwise. Although the direction is not important, all trenches 50–53 should turn in the same direction, either all in clockwise or all in counter-clockwise. Furthermore, it is preferred to have the distance between adjacent trenches constant to make the electric field distribution uniform. In FIG. 3, the turning corner of each trench 50–53 is shown as sharp for simplicity. However, rounded corners are preferred to reduce the electric field and avoid thinning of the gate oxide in the trench. For example, the radius of the corners can be in the range of 1 μm to 1 mm. Also, a submicron process for trench patterning is desirable, so that more trenches can be accommodated from a unit length of termination, hence reducing the minimum required termination length to support the breakdown voltage.

Figure 6:
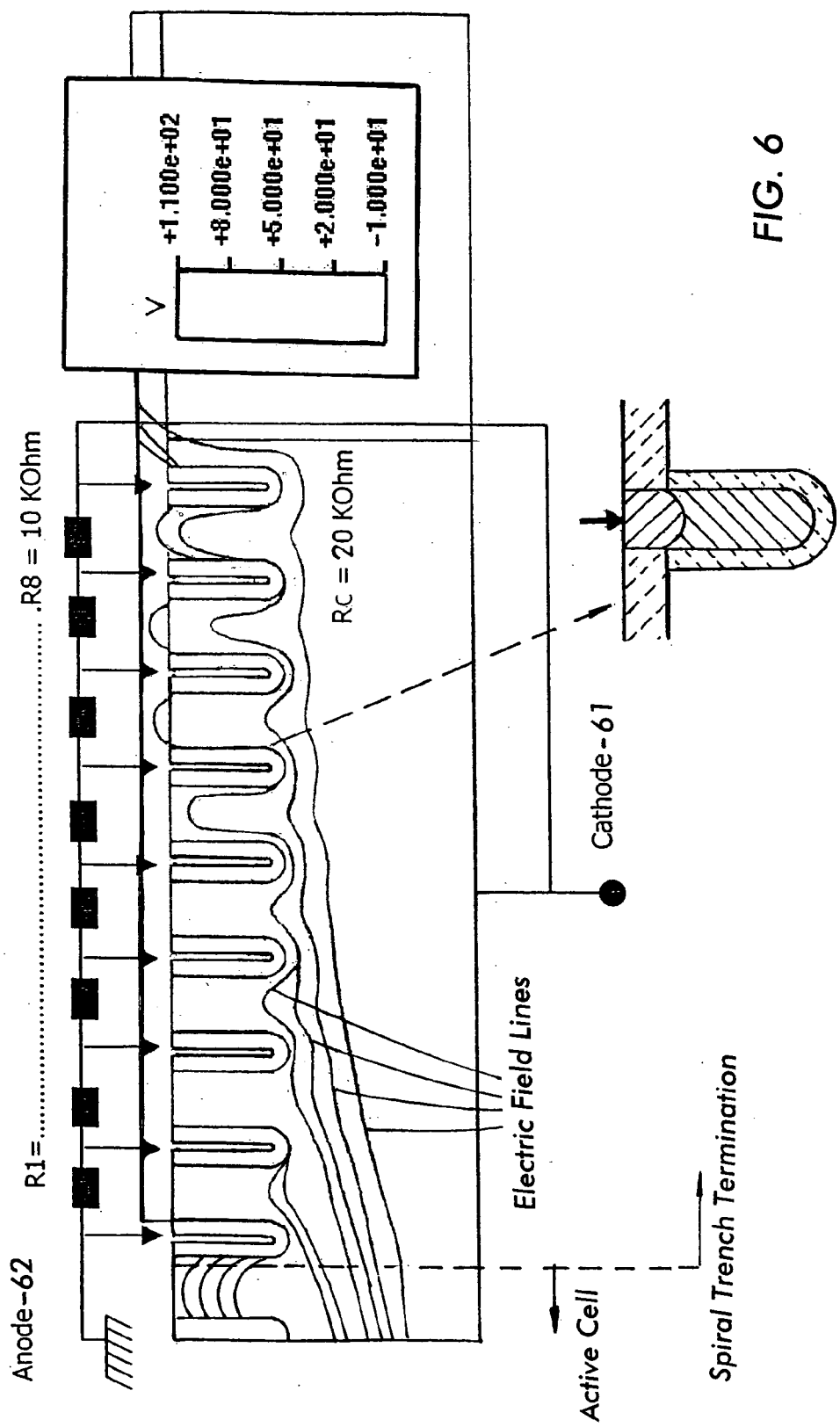
FIG. 6 shows the field distribution of the trench termination of FIGS. 3 and 4 from cathode to anode.

The termination of the invention can be used in any diode or MOSgated device. FIG. 6 is an example of its application to a trench Schottky diode, showing the field distribution and spreading across the termination when a 150 V reverse bias is applied to anode contact 62, whereby high electric field regions near the active cell are relieved. The resistance between trenches 50–53 is assumed as 10 kOhm, and the resistance between the end of the trench termination and cathode 59 is assumed as 200 kOhm. As described above, the specific resistance (resistance/unit length) of each spiral resistor can be adjusted by changing the doping level of the polysilicon and the trench geometry.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A semiconductor device comprising:
    an active region formed in a semiconductor body;
    a termination region including a spiral trench formed in said semiconductor body disposed around said active region; and
    an electrically conductive but resistive body disposed within said trench, said body including a first end and a second end, said first end being electrically connected to said active region, and said second end being electrically connected to a region of an electric potential in said termination region different from an electric potential of said active region, wherein said trench includes opposing walls and a bottom, and an insulation body disposed between said resistive body, said walls and said bottom of said trench.

2. A semiconductor device according to claim 1, wherein said insulation body is comprised of $Si_2O$.

3. A semiconductor device according to claim 1, wherein said resistive body is comprised of conductive poly silicon.

4. A semiconductor device according to claim 1, wherein said active region comprises an active region of a power diode, an IGBT or a power MOSFET.

5. A semiconductor device comprising:
    an active region; and
    a termination region, said termination region including:
    a first spiral trench disposed around said active region;
    a first resistive body disposed within said first trench;
    a second spiral trench disposed around said active region, and spaced from said first spiral trench; and
    a second resistive body disposed within said second spiral trench;
    wherein each resistive body includes a first end electrically connected to said active region and a second end electrically connected to a region in said termination region.

6. A semiconductor device according to claim 5, wherein each trench includes opposing walls and a bottom, and further comprising an insulation body disposed between each resistive body, said walls and said bottom of a respective one of said trenches.

7. A semiconductor device according to claim 6, wherein said insulation body is comprised of $Si_2O$.

8. A semiconductor device according to claim 5, wherein said resistive body is comprised of conductive polysilicon.

9. A semiconductor device according to claim 5, wherein said active region comprises an active region of a power diode, an IGBT or a power MOSFET.

10. A semiconductor device according to claim 5, wherein said trenches are interleaved.

11. A semiconductor device according to claim 5, wherein said trenches are equidistant.

12. A semiconductor device according to claim 5, wherein said first end of said first resistive body is electrically connected to a first portion of said active region and said second end of said first resistive body to a first portion of said termination region, and said first end of said second resistive body is electrically connected to a second portion of said active region and said second end of said second resistive body is electrically connected to a second portion of said termination region.

13. A semiconductor device according to claim 5, wherein said termination region further includes a third spiral trench disposed around said active region; a third resistive body disposed within said third spiral trench; a fourth spiral trench disposed around said active region; and a fourth resistive body disposed within said fourth spiral trench.

14. A semiconductor device according to claim 13, wherein each resistive body includes a first end electrically connected to a respective portion of said active region and a second end electrically connected to a respective region of said termination.

15. A semiconductor device according to claim 13, wherein said spiral trenches are interleaved.

16. A semiconductor device according to claim 13, wherein each trench is spaced from an adjacent trench by a respective distance, said distances being equal.

* * * * *

UNITED STATES PATENT AND TRADEMARK OFFICE
CERTIFICATE OF CORRECTION

| | |
|---|---|
| PATENT NO. | : 7,196,397 B2 |
| APPLICATION NO. | : 11/073123 |
| DATED | : March 27, 2007 |
| INVENTOR(S) | : David Chiola et al. |

It is certified that error appears in the above-identified patent and that said Letters Patent is hereby corrected as shown below:

On the title page, Item (75), change the second Inventor to:

--Zhe He, El Segundo, CA (US)--.

Signed and Sealed this

Twenty-sixth Day of June, 2007

JON W. DUDAS
*Director of the United States Patent and Trademark Office*